United States Patent
Takenaga et al.

(10) Patent No.: US 8,664,013 B2
(45) Date of Patent: Mar. 4, 2014

(54) CONTINUOUS PROCESSING SYSTEM, CONTINUOUS PROCESSING METHOD, AND PROGRAM

(71) Applicant: Tokyo Electron Limited, Tokyo (JP)

(72) Inventors: Yuichi Takenaga, Oshu (JP); Yukio Tojo, Oshu (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 13/804,036

(22) Filed: Mar. 14, 2013

(65) Prior Publication Data

US 2013/0260572 A1 Oct. 3, 2013

(30) Foreign Application Priority Data

Mar. 28, 2012 (JP) ................................ 2012-075057

(51) Int. Cl.
*H01L 21/00* (2006.01)

(52) U.S. Cl.
USPC .............................. 438/14; 118/696; 700/121

(58) Field of Classification Search
USPC .............................. 438/14; 118/696; 700/121
See application file for complete search history.

(56) References Cited

U.S. PATENT DOCUMENTS

| | | | |
|---|---|---|---|
| 5,991,525 A * | 11/1999 | Shah et al. | 703/2 |
| 6,300,043 B1 * | 10/2001 | Konishi et al. | 430/327 |
| 6,319,324 B1 * | 11/2001 | Nguyen et al. | 118/697 |
| 6,630,364 B2 * | 10/2003 | Johnson | 438/14 |
| 6,803,548 B2 * | 10/2004 | Wang et al. | 219/494 |
| 6,899,763 B2 * | 5/2005 | Pokharna et al. | 118/697 |
| 6,975,917 B2 * | 12/2005 | Sakamoto et al. | 700/121 |
| 7,138,607 B2 * | 11/2006 | Wang et al. | 219/390 |
| 7,953,512 B2 * | 5/2011 | Takenaga et al. | 700/121 |
| 8,216,648 B2 * | 7/2012 | Matsunaga et al. | 427/579 |
| 8,354,135 B2 * | 1/2013 | Takenaga et al. | 427/8 |
| 8,361,902 B2 * | 1/2013 | Kato | 438/680 |
| 2003/0066482 A1 * | 4/2003 | Pokharna et al. | 118/696 |
| 2004/0238519 A1 * | 12/2004 | Sakamoto et al. | 219/390 |
| 2009/0078197 A1 * | 3/2009 | Takenaga et al. | 118/708 |
| 2009/0232967 A1 * | 9/2009 | Takenaga et al. | 427/9 |
| 2011/0129619 A1 * | 6/2011 | Matsunaga et al. | 427/579 |
| 2012/0247511 A1 * | 10/2012 | Okada et al. | 134/19 |
| 2013/0239993 A1 * | 9/2013 | Ogawa et al. | 134/19 |
| 2013/0256293 A1 * | 10/2013 | Takenaga et al. | 219/413 |
| 2013/0260039 A1 * | 10/2013 | Takenaga et al. | 427/314 |
| 2013/0260328 A1 * | 10/2013 | Takenaga et al. | 432/9 |
| 2013/0260572 A1 * | 10/2013 | Takenaga et al. | 438/758 |

FOREIGN PATENT DOCUMENTS

JP 2011166160 8/2011

* cited by examiner

*Primary Examiner* — Laura Menz (74) *Attorney, Agent, or Firm* — Cantor Colburn LLP (57) ABSTRACT

In a continuous processing system, a controller of a heat treatment apparatus calculates a weight of each layer from input target film thicknesses of a phosphorous-doped polysilicon film (D-poly film) and an amorphous silicon film (a-Si film), and calculates activation energy of stacked films based on the calculated weight and activation energy. The controller prepares a stacked film model based on the calculated activation energy and a relationship of a temperature of each zone and film thicknesses of the D-poly film and the a-Si film, and calculates an optimum temperature of each zone by using the prepared stacked film model. The controller controls power controllers of heaters to set a temperature in a reaction tube to be the calculated temperature of each zone and forms stacked films on a semiconductor wafer by controlling a pressure adjusting unit, flow rate adjusting units, etc.

7 Claims, 8 Drawing Sheets

SYNTHETIC LOGIC MODEL

WEIGHT OF FIRST LAYER × D-poly MODEL + WEIGHT OF SECOND LAYER × a-Si MODEL

FIG. 4B $$\text{WEIGHT OF FIRST LAYER} = \frac{\text{TARGET FILM THICKNESS OF D-poly FILM}}{\text{TARGET FILM THICKNESS OF a-Si FILM} + \text{TARGET FILM THICKNESS OF D-poly FILM}}$$

$$\text{WEIGHT OF SECOND LAYER} = \frac{\text{TARGET FILM THICKNESS OF a-Si FILM}}{\text{TARGET FILM THICKNESS OF a-Si FILM} + \text{TARGET FILM THICKNESS OF D-poly FILM}}$$

FIG. 4C

|  | PROCESS CLASSES | ACTIVATION ENERGY (eV) |
| --- | --- | --- |
| SECOND LAYER (SURFACE LAYER) | a-Si | 2 |
| FIRST LAYER (BOTTOM LAYER) | D-poly | 1 |

|  | TEMPERATURE (°C) |
|---|---|
| FIRST ZONE | 580.0 |
| SECOND ZONE | 580.0 |
| THIRD ZONE | 580.0 |
| FORTH ZONE | 580.0 |
| FIFTH ZONE | 580.0 |

FIG. 6B

|  | FILM THICKNESS (nm) |
|---|---|
| FIRST ZONE | 88.00 |
| SECOND ZONE | 89.00 |
| THIRD ZONE | 90.00 |
| FORTH ZONE | 91.00 |
| FIFTH ZONE | 92.00 |

FIG. 6C

|  | PROCESS CLASSES | TARGET FILM THICKNESS (nm) |
|---|---|---|
| SECOND LAYER (SURFACE LAYER) | a-Si | 40 |
| FIRST LAYER (BOTTOM LAYER) | D-poly | 60 |

FIG. 7

|  | OPTIMUM TEMPERATURE (°C) |
|---|---|
| FIRST ZONE | 585.8 |
| SECOND ZONE | 584.8 |
| THIRD ZONE | 584.1 |
| FORTH ZONE | 584.3 |
| FIFTH ZONE | 582.7 |

FIG. 8

CONTINUOUS PROCESSING SYSTEM, CONTINUOUS PROCESSING METHOD, AND PROGRAM

CROSS-REFERENCE TO RELATED PATENT APPLICATIONS

This application claims the benefit of Japanese Patent Application No. 2012-075057, filed on Mar. 28, 2012, in the Japan Patent. Office, the disclosure of which is incorporated herein in its entirety by reference.

BACKGROUND OF THE INVENTION

1. Field of the Invention

The present invention relates to a continuous processing system, a continuous processing method, and a program, which continuously perform processes on an object to be processed, such as a semiconductor wafer.

2. Description of the Related Art

During processes of manufacturing semiconductor devices, continuous processes of forming stacked films on an object to be processed, for example, the semiconductor wafer, are performed by continuously performing film-forming processes on semiconductor wafer. There have been various suggestions as the continuous processes of forming stacked films, and for example, Patent Document 1 discloses a method of efficiently forming stacked films having different film compositions without problem such as oxidization by continuously forming films included in the stacked films in a same processing chamber while varying material types and/or film-forming conditions.

However, according to such continuous processes, there are cases that only an overall film thickness of stacked films is measured and a film thickness of each layer cannot be measured as, for example, when stacked films are formed by forming a phosphorous (P)-doped polysilicon film (D-poly film) and then forming an amorphous silicon film (a-Si film). In the continuous processes of such stacked films, an operator of a continuous processing system minutely adjusts film-forming conditions, such as a temperature, based on experiences or senses by referring to an overall film thickness of stacked films. Accordingly, a continuous processing system and a continuous processing method are required for an operator who does not have any knowledge or experience with regard to a continuous processing system or process for forming stacked films to easily adjust continuous processes performed on an object to be processed.

(Patent Document 1) Japanese Laid-Open Patent. Publication No. 2011-166160

SUMMARY OF THE INVENTION

The present invention provides a continuous processing system, a continuous processing method, and a program, which easily adjust continuous processes performed on an abject to be processed.

According to an aspect of the present invention, there is provided a continuous processing system for forming stacked films by forming a first film on an object to be processed and then forming a second film, the continuous processing system including: a heating unit which heats an inside of a processing chamber accommodating a plurality of objects to be processed; a heat treatment condition storage unit which stores film-forming conditions of the first film and the second film, the film-forming conditions including a temperature in the processing chamber heated by the heating unit; a first model storage unit which stores a first model indicating a relationship between the temperature in the processing chamber and a film thickness of the first film to be formed; a second model storage unit which stores a second model indicating a relationship between the temperature in the processing chamber and a film thickness of the second film to be formed; a weight calculating unit which calculates weights of the first film and the second film, based on target film thicknesses of the first film and the second film; a stacked film model preparing unit which prepares a stacked film model indicating a relationship between the temperature in the processing chamber and a film thickness of the stacked films, based on the weights calculated by the weight calculating unit, the first model stored in the first model storage unit, and the second model stored in the second model storage unit; a temperature calculating unit which calculates the temperature in the processing chamber for obtaining a desired film thickness of the stacked films, based on the stacked film model prepared by the stacked film model preparing unit; and an adjusting unit which adjusts the film thickness of the formed stacked films to be the desired film thickness by changing the temperature in the processing chamber stored in the heat treatment condition storage unit to the temperature calculated by the temperature calculating unit and forming the stacked films at the changed temperature.

According to another aspect of the present invention, there is provided a continuous processing method for forming stacked films by forming a first film on an object to be processed and then forming a second film, which is performed by a continuous processing system including a heating unit which heats an inside of a processing chamber accommodating a plurality of objects to be processed; a heat is treatment condition storage unit which stores film-forming conditions of the first film and the second film, the film-forming conditions including a temperature in the processing chamber heated by the heating unit; a first model storage unit which stores a first model indicating a relationship between the temperature in the processing chamber and a film thickness of the first film to be formed; and a second model storage unit which stores a second model indicating a relationship between the temperature in the processing chamber and a film thickness of the second film to be formed, the continuous processing method including: calculating weights of the first film and the second film, based on target film thicknesses of the first film and the second film; preparing a stacked film model indicating a relationship between the temperature in the processing chamber and a film thickness of the stacked films, based on the weights calculated in the calculating of the weight, the first model stored in the first model storage unit, and the second model stored in the second model storage unit; calculating the temperature in the processing chamber for obtaining a desired film thickness of the stacked films, based on the stacked film model prepared in the preparing; and adjusting the film thickness of the formed stacked films to be the desired film thickness by changing the temperature in the processing chamber stored in the heat treatment condition storage unit to the temperature calculated in the calculating of the temperature and forming the stacked films at the changed temperature.

According to another aspect of the present invention, there is provided a program which operates a computer as a continuous processing system for forming stacked films by forming a first film on an object to be processed and then forming a second film, the continuous processing system including: a heat treatment condition storage unit which stores film-forming conditions of the first film and the second film, the film-forming conditions including a temperature in the processing chamber heated by a heating unit which heats an inside of the processing chamber accommodating a plurality of objects to be processed; a first model storage unit which stores a first model indicating a relationship between the temperature in the processing chamber and a film thickness of the first film to be formed; a second model storage unit which stores a second model indicating a relationship between the temperature in the processing chamber and a film thickness of the second film to be formed; a weight calculating unit which calculates is weights of the first film and the second film, based on target film thicknesses of the first film and the second film; a stacked film model preparing unit which prepares a stacked film model indicating a relationship between the temperature in the processing chamber and a film thickness of the stacked films, based on the weights calculated by the weight calculating unit, the first model stored in the first model storage unit, and the second model stored in the second model storage unit; a temperature calculating unit which calculates the temperature in the processing chamber for obtaining a desired film thickness of the stacked films, based on the stacked film model prepared by the stacked film model preparing unit; and an adjusting unit which adjusts the film thickness of the formed stacked films to be the desired film thickness by changing the temperature in the processing chamber stored in the heat treatment condition storage unit to the temperature calculated by the temperature calculating unit and forming the stacked films at the changed temperature.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention achieved on the basis of the findings given above will now be described with reference to the accompanying drawing. In the following description, the constituent elements having substantially the same function and arrangement are denoted by the same reference numerals, and a repetitive description will be made only when necessary.

Hereinafter, an embodiment of the present invention will be described based on an example where a heat treatment system, a heat treatment method, and a program are applied to a batch-type vertical heat treatment apparatus shown in FIG. 1. Also, in the present embodiment, continuous processes of forming stacked films are performed by forming a phosphorus (P)-doped polysilicon film (D-poly film) by using a $SiH_4$ gas as a film-forming gas and a $PH_3$ gas as a doping gas, and then forming an amorphous silicon film (a-Si film) by using a $SiH_4$ gas as a film-forming gas.

Figure 1:
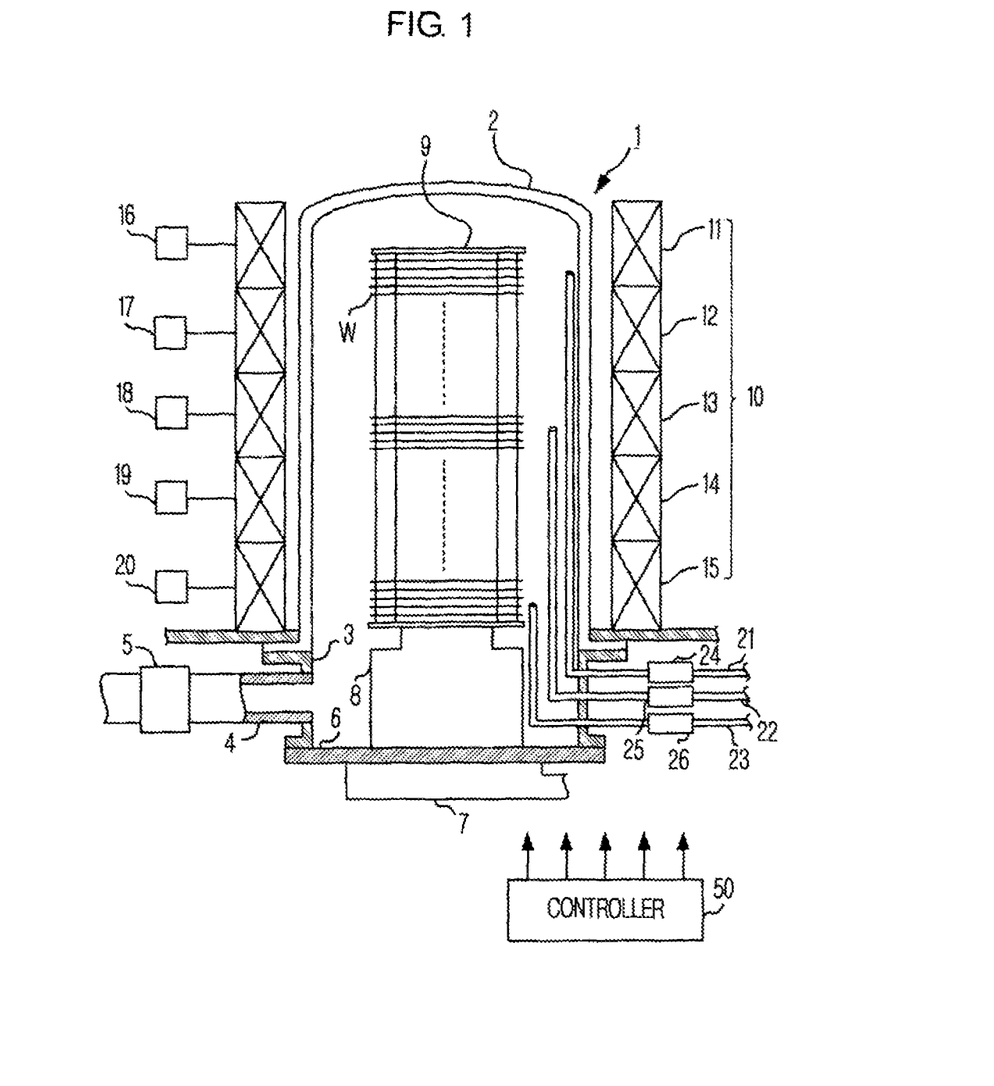
FIG. 1 is a view for showing a configuration of a heat treatment apparatus according to an embodiment of the present invention.

As shown in FIG. 1, a heat treatment apparatus 1 according to the present embodiment includes a reaction tube 2 that has an approximate cylindrical shape and a ceiling. The reaction tube 2 is disposed such that a length direction of the reaction tube 2 is in a vertical direction. The reaction tube 2 is formed of a material having excellent heat resistance and corrosion resistance, for example, quartz.

A manifold 3 having an approximate cylindrical shape is formed at a bottom of the reaction tube 2. A top of the manifold 3 is hermetically combined to the bottom of the reaction tube 2. An exhaust pipe 4 for exhausting a gas inside the reaction tube 2 is hermetically connected to the manifold 3. A pressure adjustor 5, including a valve, a vacuum pump, etc., is formed at the exhaust pipe 4 so as to adjust the inside of the reaction tube 2 to be at a desired pressure (vacuum level).

A cover body 6 is disposed at the bottom of the manifold (reaction tube 2). The is cover body 6 is capable of moving up and down by a boat elevator 7. When the cover body 6 moves up by the boat elevator 7, the bottom (furnace entrance portion) of the manifold 3 (reaction tube 2) is closed. When the cover body 6 moves down by the boat elevator 7, the bottom (furnace entrance portion) of the reaction tube 2 is opened.

A wafer boat 9 is formed on the cover body 6 with a heat insulating tube (insulation body) 8 therebetween. The wafer boat 9 is a wafer holding unit for accommodating (holding) an object to be processed, for example, a semiconductor wafer W, and in the present embodiment, a plurality of semiconductor wafers W, for example, 150 semiconductor wafers W, may be accommodated at predetermined intervals in a vertical direction. Then, the semiconductor wafer W is loaded into the reaction tube 2 by accommodating the semiconductor wafer W in the wafer boat 9 and moving up the cover body 6 by using the boat elevator 7.

Figure 3:
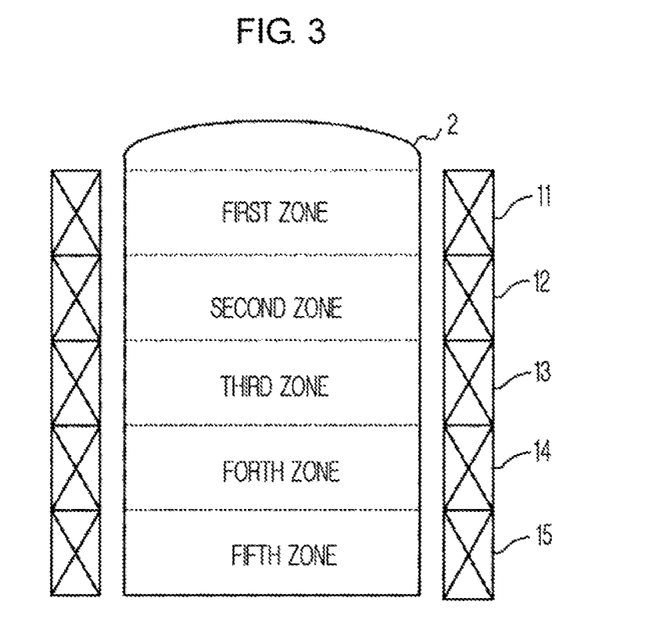
FIG. 3 is a view showing zones in a reaction tube.

A heater unit 10 formed of, for example, a resistance heating element, is formed around the reaction tube 2 to surround the reaction tube 2. The inside of the reaction tube 2 is heated up to a predetermined temperature by the heater unit 10, and accordingly, the semiconductor wafer W is heated up to the predetermined temperature. The heater unit 10 includes, for example, heaters 11 through 15 disposed in five stages, wherein power controllers 16 through 20 are respectively connected to the heaters 11 through 15. Accordingly, by independently supplying power to the power controllers 16 through 20, the heaters 11 through 15 may be independently heated up to desired temperatures. As such, the inside of the reaction tube 2 is divided into five zones as shown in FIG. 3, by the heaters 11 through 15. For example, when a top zone (first zone) in the reaction tube 2 is to be heated, the heater 11 is heated up to a desired temperature by controlling the power controller 16. When a center zone (third zone) in the reaction tube 2 is to be heated, the heater 13 is heated up to a desired temperature by controlling the power controller 18. When a bottom zone (fifth zone) in the reaction tube 2 is to be heated, the heater 15 is heated up to a desired temperature by controlling the power controller 20.

Also, a plurality of process gas supply pipes for supplying process gases into the reaction tube 2 are formed at the manifold 3. In the present embodiment, a $SiH_4$ gas may be used as a film-forming gas and a $PH_3$ gas may be used as a doping gas. Also, is three process gas supply pipes 21 through 23 for supplying a process gas to the manifold 3 are shown in FIG. 1.

The process gas supply pipe 21 is formed to extend from a side of the manifold 3 to a top vicinity (first zone) of the wafer boat 9. The process gas supply pipe 22 is formed to extend from the side of the manifold 3 to a center vicinity (third zone) of the wafer boat 9. The process gas supply pipe 23 is formed to extend from the side of the manifold 3 to a bottom vicinity (fifth zone) of the wafer boat 9.

Flow rate adjustors 24 through 26 are respectively formed at the process gas supply pipes 21 through 23. Each of the flow rate adjustors 24 through 26 includes a mass flow controller (MFC) for adjusting a flow rate of the process gases which flows the inside of the process gas supply pipes 21 through 23. Accordingly, the process gases supplied from the process gas supply pipes 21 through 23 are adjusted to desired flow rates by the flow rate adjustors 24 through 26, and are supplied into the reaction tube 2.

Figure 2:
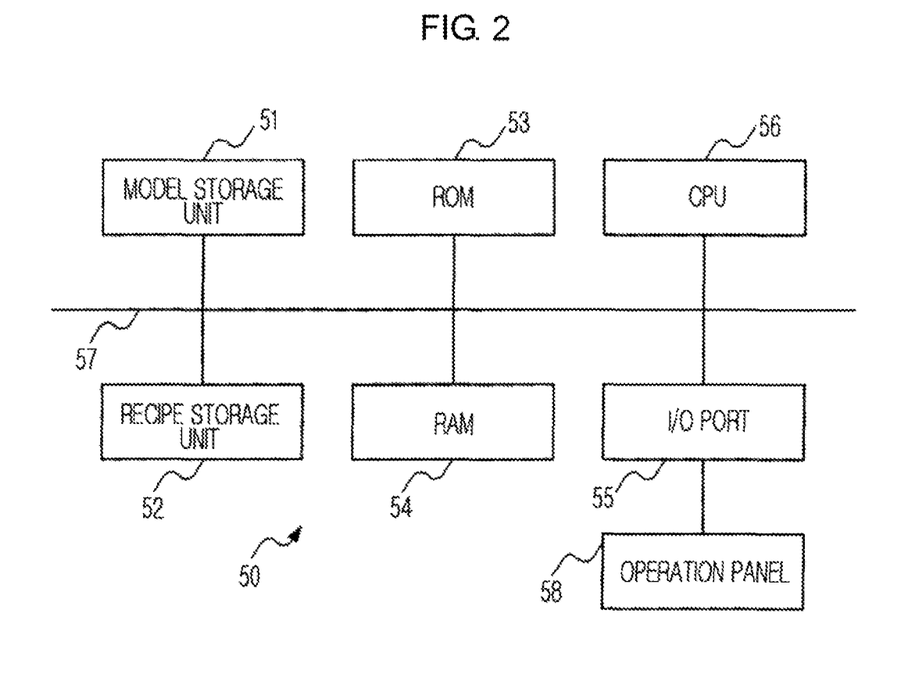
FIG. 2 is a diagram showing a configuration example of a controller of FIG. 1.

Also, the heat treatment apparatus 1 includes a controller 50 for controlling process parameters, such as a gas flow rate, a pressure, and a temperature of a process atmosphere in the reaction tube 2. The controller 50 outputs a control signal to the flow rate adjustors 24 through 26, the pressure adjustor 5, the power controllers 16 through 20 of the heaters 11 through 15, etc. FIG. 2 shows a configuration of the controller 50.

As shown in FIG. 2, the controller 50 includes a model storage unit 51, a recipe storage unit 52, a read only memory (ROM) 53, a random access memory (RAM) 54, an input/output (I/O) port 55, a central processing unit (CPU) 56, and a bus 57 connecting these elements.

The model storage unit 51 stores a synthetic logic model indicating a plurality of model types of synthetic logic. Also, activation energy according to each of process classes for calculating a model for stacked films (continuous processes) is specified in the model storage unit 51. The model will be described in detail later.

The recipe storage unit 52 stores a process recipe for determining a control order, according to a type of a film-forming process performed by the heat treatment apparatus 1. The process recipe is a recipe prepared according to a process actually performed is by a user, and defines a temperature change of each unit, a pressure change in the reaction tube 2, a timing of starting and stopping a gas supply, and a supply amount of a gas from when the semiconductor wafer W is loaded into the reaction tube 2 to when the semiconductor wafer W that has been processed is unloaded.

The ROM 53 includes an electrically erasable and programmable read only memory (EEPROM), a flash memory, and a hard disk, and is a recording medium having recorded thereon an operation program of the CPU 56, or the like.

The RAM 54 operates as a work area of the CPU 56.

The I/O port 55 supplies measurement signals regarding a temperature, a pressure, and a flow rate of a gas, to the CPU 56 and outputs a control signal from the CPU 56 to each unit (the pressure adjustor 5, the power controllers 16 through 20 of the heaters 11 through 15, the flow rate adjustors 24 through 26, or the like). Also, the I/O port 55 is connected to an operation panel 58 for the operator to operate the heat treatment apparatus 1.

The CPU 56 plays a pivotal role of the controller 50, executes an operation program stored in the ROM 53, and controls operations of the heat treatment apparatus 1 according to the process recipe stored in the recipe storage unit 52 based on an indication from the operation panel 58.

Also, the CPU 56 calculates the model for stacked films (continuous processes) based on the synthetic logic model indicating the plurality of model types of synthetic logic and the activation energy specified according each of to the process classes. The CPU 56 calculates temperatures of the first through fifth zones in the reaction tube 2 based on the calculated model for stacked films. Also, the CPU 56 adjusts the temperature in the reaction tube 2 by outputting a control signal to a power controller or the like, such that the temperatures of the first through fifth zones in the reaction tube 2 are equal to the calculated temperatures. Also, the CPU 56 updates the corresponding temperatures stored in the recipe storage unit 52 to the calculated temperatures.

The bus 57 transfers information between the units.

The model, etc. stored in the model storage unit 51 will now be described. As described above, the model storage unit 51 stores the synthetic logic model indicating the plurality of model types of synthetic logic, and the activation energy specified is according to each of the process classes.

Figure 4A:
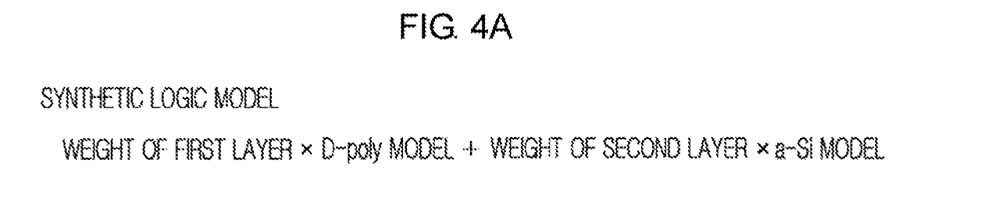
FIGS. 4A through 4C are views for describing a synthetic logic model.

FIG. 4A shows an example of the synthetic logic model. The synthetic logic model indicates synthetic logic of a plurality of types of process models, and is indicated by "first layer weight×D-poly model+second layer weight×a-Si model", as shown in FIG. 4A according to stacked films including a D-poly film as a first layer and an a-Si film as a second layer as in the present example.

Figure 4B:
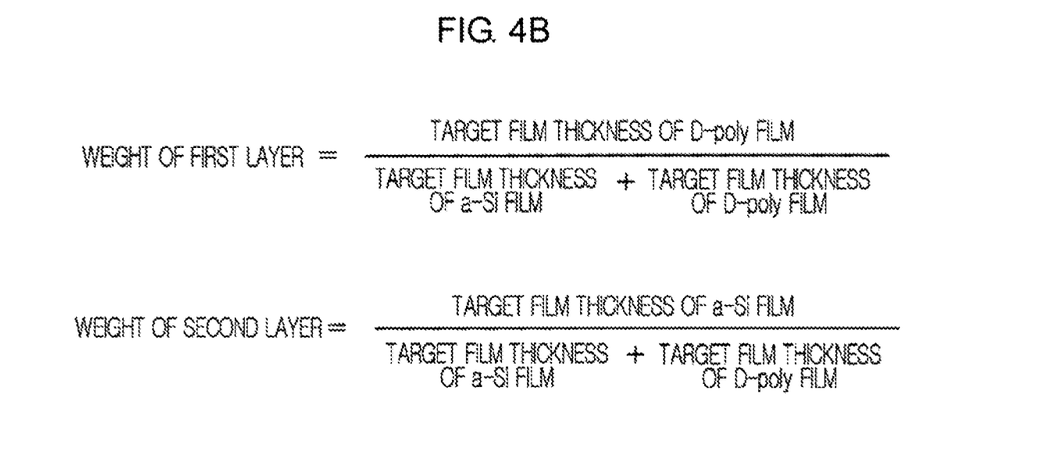
Figure 4C:
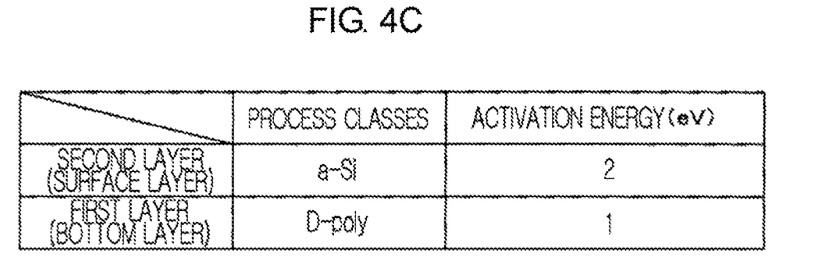

Such weights may be specified by using a target film thickness of each layer, as shown in FIG. 4B. Also, the model storage unit 51 stores the activation energy specified according to each of process classes, as shown in FIG. 4C. The weight of each layer is calculated from the target film thickness, and the activation energy of the stacked films (continuous processes) is calculated from the calculated weight and the activation energy. For example, as shown in FIG. 6C described later, when a target film thickness of the first layer is 60 nm and a target film thickness of the second layer is 40 nm, the weight of the first layer is "60/100=0.6" and the weight of the second layer is "40/100=0.4". Thus, the activation energy for the stacked films (continuous processes) is "1 eV×0.6+2 eV×0.4=1.4 eV". The model for the stacked films (continuous processes) is prepared based on the calculated activation energy and relationships of the temperature of each zone with respect to the film thicknesses of the first layer (D-poly film) and the second layer (a-Si film). The prepared model for the stacked films shows, for example, a relationship between a temperature of a predetermined zone and a film thickness of the stacked films formed in each of the zones. Also, an optimum temperature of each zone is calculated based on the prepared model for the stacked films.

Also, the synthetic logic may be any synthetic logic that can prepare the model for the stacked films (continuous processes) by using a weight according to the target film thickness of each layer, and for example, the activation energy may not be used.

The model may be learned by adding an extended Kalman filter or the like to software to implement a learning function since a default value may not be at an optimum according to process conditions or a status of an apparatus. The learning function using the Kalman filter may be implemented by using, for example, a technique disclosed in U.S. Pat. No. 5,991,525.

Figure 5:
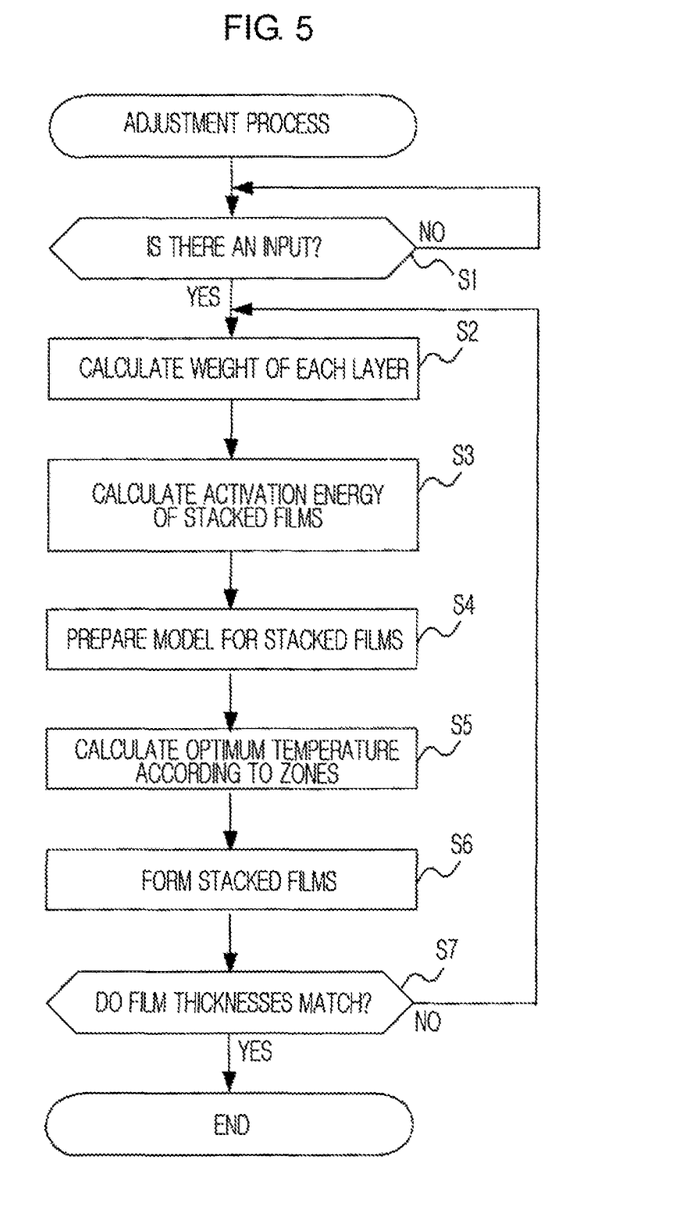
FIG. 5 is a flowchart for describing an adjustment process.

An adjustment method (adjustment process) for adjusting a film thickness of stacked films (film thicknesses of a D-poly film and an a-Si film) formed by using the heat treatment apparatus 1 described above will now be described. The adjustment process may be performed during a setup operation before a film-forming process, or simultaneously with the film-forming process FIG. 5 is a flowchart for describing the adjustment process according to an embodiment of the present invention.

Figure 6A:
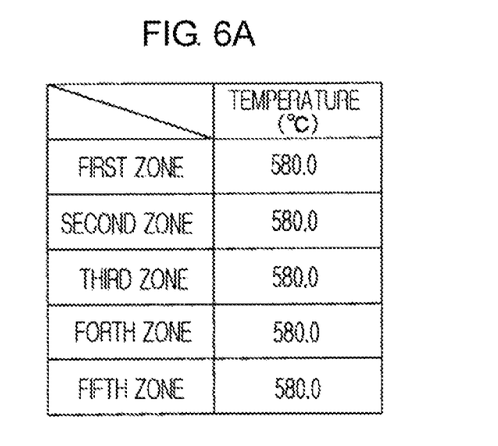
FIGS. 6A through 6C are views for showing a temperature, a film thickness, a process class, and a target film thickness input by an operator.
Figure 6B:
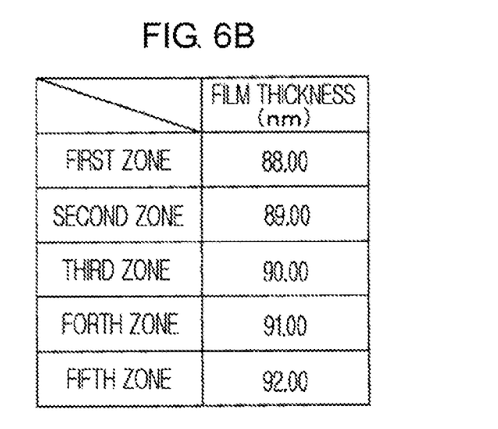
Figure 6C:
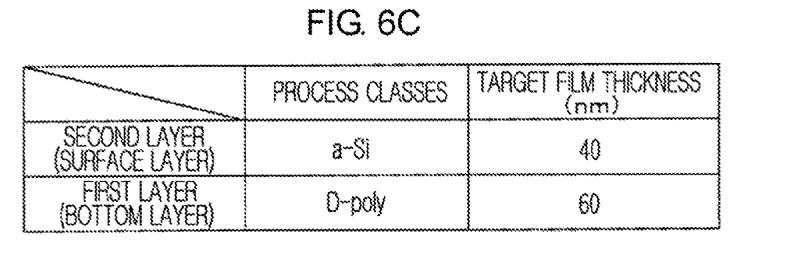

According to the adjustment process, the operator operates the operation panel 58 to input temperature and film thickness of stacked films according to each of zones in the reaction tube 2, as shown in FIGS. 6A and 68. Then, the operator operates the operation panel 58 to select a process class (in the present embodiment, D-poly and a-Si) and to input target film thicknesses of a D-poly film and an a-Si film, as shown in FIG. 6C.

The controller 50 (CPU 56) determines whether required information, such as the process class, shown in FIGS. 6A through 6C is input (operation S1). If it is determined that the required information is input (operation S1; Yes), the CPU 56 calculates the weight of each layer based on the target film thickness of the D-poly film and the target film thickness of the a-Si film (operation S2). In the present embodiment, as shown in FIG. 6C, the weight of the first layer is "60/100=0.6" and the weight of the second layer is "40/100=0.4" when the target film thickness of the first layer is 60 nm and the target film thickness of the second layer is 40 nm.

Then, the CPU 56 calculates the activation energy of the stacked films based on the calculated weight and the activation energy stored in the model storage unit 51 (operation S3). In the present embodiment, the activation energy for the stacked films (continuous processes) is calculated according to "1 eV×0.6+2 eV×0.4=1.4 eV".

Figure 7:
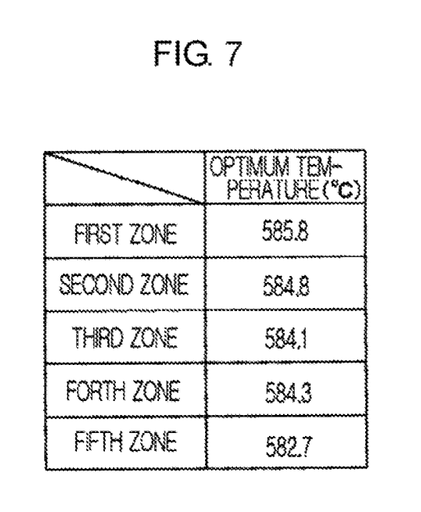
FIG. 7 is a view for showing a calculated temperature.

Next, the CPU 56 prepares the model for stacked films based on the calculated activation energy and the relationship between the temperature of each zone and the film thicknesses of the D-poly film and the a-Si film (operation S4). The CPU 56 uses the prepared model for the stacked films so as to calculate an optimum temperature according to each of zones, as shown in FIG. 7 (operation S5).

Then, the CPU 56 reads out a process recipe corresponding to the input process class, from the recipe storage unit 52. The process recipe includes process conditions, such as a pressure and a flow rate of a process gas (for example, a $SiH_4$ gas), in the reaction tube 2. Then, the CPU 56 moves down the boat elevator 7 (cover body 6) so as to dispose the wafer boat 9, on which the semiconductor wafer W (monitor wafer) is mounted in at least each zone, on the cover body 6. Next, the CPU 56 moves up the boat elevator 7 (cover body 6) so as to load the wafer boat 9 into the reaction tube 2. Then, the CPU 56 sets the temperature in the reaction tube 2 to be the calculated temperature of each zone by controlling the power controllers 16 through 20 of the heaters 11 through 15 and forms the stacked films on the semiconductor wafer W by controlling the pressure adjustor 5, the flow rate adjustors 24 through 26, etc. according to a recipe read out from the recipe storage unit 52 (operation S6). Also, the stacked films are formed by forming the P-doped polysilicon film (D-poly film) by using the $SiH_4$ gas as the film-forming gas and the $PH_3$ gas as the doping gas, and then forming the amorphous silicon film (a-Si film) by using the $SiH_4$ gas as the film-forming gas.

When the stacked films are formed, the CPU 56 moves down the boat elevator 7 (cover body 6) to unload the semiconductor wafer W on which the stacked films are formed, and transfers the semiconductor wafer W to, for example, a measuring apparatus (not shown) to measure a film thickness of the stacked films formed on the semiconductor wafer W. When the film thickness of the stacked films formed on each semiconductor wafer W is measured, the measuring apparatus transmits, for example, data of the measured film thickness of the stacked films to the heat treatment apparatus 1 (CPU 56). Alternatively, the operator may operate the operation panel 58 to input measurement results.

Figure 8:
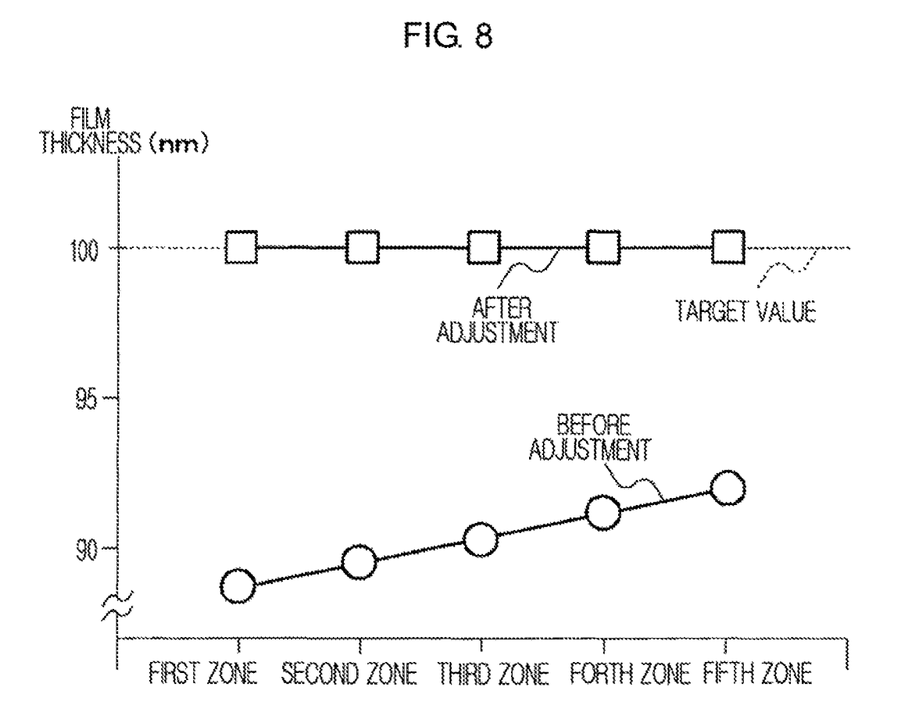
FIG. 8 is a view for showing a film thickness after adjustment.

Upon receiving the data of the measured film thickness of the stacked films, the CPU 56 determines whether the received data of the measured film thickness matches the input target film thickness of the stacked films (operation S7). In the present embodiment, as shown in FIG. 8, the received data of the measured film thickness and the input target film thickness of the stacked films match each other. As such, even an operator who does not have any knowledge or experience regarding a heat treatment apparatus or a heat treatment process can form stacked films as targeted on the surface of the semiconductor wafer W. When it is determined that the received data of the measured film thickness does not match the input target film thickness of the stacked films (operation S7; No), the CPU 56 returns to operation S2.

On the other hand, if it is determined that the received data of the measured film thickness matches the input target film thickness of the stacked films (operation S7; Yes), the CPU 56 ends the process.

As described above, according to the present embodiment, the stacked films can be formed on the surface of the semiconductor wafer W as targeted by adjusting the temperature of each zone by only inputting the temperature and the film thickness of the stacked films in each zone of the reaction tube 2, the process class, the target film thickness of the D-poly film, and the target film thickness of the a-Si film. Accordingly, even an operator who does not have any knowledge or experience regarding a heat treatment apparatus or a heat treatment process can easily perform the continuous processes on the semiconductor wafer W.

The present invention is not limited to the above embodiments, and may be variously modified and applied. Hereinafter, other embodiments applicable to the present invention will be described.

In the above embodiments, the measured film thickness of the stacked films is matched to the target film thickness of the stacked films, but alternatively, for example, an allowable range, such as about a ±1% range, may be set for the target film thickness of the stacked films, and the adjustment process may be ended when the measured film thickness of the stacked films is within this range.

In the above embodiments, the $SiH_4$ gas is used as the film-forming gas and the $PH_3$ gas is used as the doping gas to form the P-doped polysilicon film (D-poly film), but a doped impurity is not limited to phosphorous and may be, for example boron (B). Also, the film-forming gas is not limited to $SiH_4$ and may be, for example, $Si_2H_6$ gas. Also, the $SiH_4$ gas is used to form the a-Si film, but any one of various film-forming gases capable of forming the a-Si film may be used.

Also, in the above embodiments, the stacked films of the D-poly film and the a-Si film are used. The stacked films of the present invention may be the stacked films of which only the overall film thickness can be measured and a film thickness of each layer is unable to be measured, and may alternatively include, for example, BSG and TEOS. Also, the number of stacked layers of the stacked films is not limited to 2, and may be 3 is or more.

In the above embodiments, the number of stages (number of zones) in a heater is five, but may alternatively be 4 or less or 6 or more. The number of semiconductor wafers W extracted from each zone, or the like may be arbitrarily set.

In the above embodiments, a batch-type heat treatment apparatus having a single pipe structure is used, but alternatively, for example, a batch-type heat treatment apparatus having a reaction tube 2 of a double pipe structure of an inner pipe and an outer pipe may be used. Also, the present invention is not limited to processing a semiconductor wafer, and for example, a flat panel display (FPD) substrate, a glass substrate, a plasma display panel (PDP) substrate, or the like may be processed.

The controller 50 according to an embodiment of the present invention may be realized by using a general computer system, not by an exclusive system. For example, the controller 50 performing the above-described process may be formed by installing a program for executing the above process in a general-purpose computer from a recording medium (flexible disk, CD-ROM, or the like) storing the program.

A unit for supplying the program is arbitrary. The program may be supplied through a predetermined recording medium as described above, but alternatively, for example, may be supplied through a communication wire, a communication network, or a communication system. Here, for example, the program may be displayed on a bulletin board system (BBS) of the communication network and provided together with carrier waves through a network. Then, the program provided as such may be activated, and performed like another application program under a control of an operating system (OS) so as to perform the above process.

According to the present invention, a heat treatment performed on an object to be processed may be easily adjusted.

The present invention is useful for a continuous processing system for continuously processing an object to be processed, such as a semiconductor wafer.

What is claimed is:

1. A continuous processing system for forming stacked films by forming a first film on an object and then forming a second film, the continuous processing system comprising:
   a heating unit which heats an inside of a processing chamber accommodating a plurality of objects;
   a heat treatment condition storage unit which stores film-forming conditions of the first film and the second film, the film-forming conditions including a temperature in the processing chamber heated by the heating unit;
   a first model storage unit which stores a first model indicating a relationship between the temperature in the processing chamber and a film thickness of the first film to be formed;
   a second model storage unit which stores a second model indicating a relationship between the temperature in the processing chamber and a film thickness of the second film to be formed;
   a weight calculating unit which calculates weights of the first film and the second film, based on target film thicknesses of the first film and the second film;
   a stacked film model preparing unit which prepares a stacked film model indicating a relationship between the temperature in the processing chamber and a film thickness of the stacked films based on the weights calculated by the weight calculating unit, the first model stored in the first model storage unit, and the second model stored in the second model storage unit;
   a temperature calculating unit which calculates the temperature in the processing chamber for obtaining a desired film thickness of the stacked films, based on the stacked film model prepared by the stacked film model preparing unit; and
   an adjusting unit which adjusts the film thickness of the formed stacked films to be the desired film thickness by changing the temperature in the processing chamber stored in the heat treatment condition storage unit to the temperature calculated by the temperature calculating unit and forming the stacked films at the changed temperature.

2. The continuous processing system of claim 1, wherein the stacked film model preparing unit calculates activation energy of the stacked films based on the weights calculated by the weight calculating unit, activation energy of the first film and activation energy of the second film, and prepares the stacked film model based on the calculated activation energy of the stacked films, the first model, and the second model.

3. The continuous processing system of claim 1, wherein the processing chamber is divided into a plurality of zones,
   the heating unit is capable of setting a temperature according to each of the plurality of zones in the processing chamber,
   the first model, the second model, and the stacked film model indicate a relationship between a change of the temperature in the processing chamber according to each of the plurality of zones and a change of a film thickness according to each of the plurality of zones, and
   the temperature calculating unit calculates the temperature in the processing chamber according to each of the plurality of zones.

4. A continuous processing method for forming stacked films by forming a first film on an object and then forming a second film, which is performed by a continuous processing system comprising a heating unit which heats an inside of a processing chamber accommodating a plurality of objects, a heat treatment condition storage unit which stores film-forming conditions of the first film and the second film, the film-forming conditions including a temperature in the processing chamber heated by the heating unit, a first model storage unit which stores a first model indicating a relationship between the temperature in the processing chamber and a film thickness of the first film to be formed, and a second model storage unit which stores a second model indicating a relationship between the temperature in the processing chamber and a film thickness of the second film to be formed, the continuous processing method comprising:
   calculating weights of the first film and the second film, based on target film thicknesses of the first film and the second film,
   preparing a stacked film model indicating a relationship between the temperature in the processing chamber and a film thickness of the stacked films, based on the weights calculated in the calculating of the weight, the first model stored in the first model storage unit, and the second model stored in the second model storage unit;
   calculating the temperature in the processing chamber for obtaining a desired film thickness of the stacked films, based on the stacked film model prepared in the preparing; and
   adjusting the film thickness of the formed stacked films to be the desired film thickness by changing the temperature in the processing chamber stored in the heat treatment condition storage unit to the temperature calculated in the calculating of the temperature and forming the stacked films at the changed temperature.

5. The continuous processing method of claim 4, wherein the preparing comprises calculating activation energy of the stacked films based on the weights calculated in the calculating of the weight, activation energy of the first film and activation energy of the second film, and preparing the stacked film model based on the calculated activation energy of the stacked films, the first model and the second model.

6. The continuous processing method of claim 1, wherein the processing chamber is divided into a plurality of zones,
the heating unit is capable of setting a temperature according to each of the plurality of zones in the processing chamber,
the first model, the second model, and the stacked film model indicate a relationship between a change of the temperature in the processing chamber according to each of the plurality of zones and a change of a film thickness according to each of the plurality of zones, and
the calculating of the temperature comprises calculating the temperature in the processing chamber according to each of the plurality of zones.

7. A program which is recorded on non-transitory computer-readable medium and operates a computer as a continuous processing system for forming stacked films by forming a first film on an object and then forming a second film, the continuous processing system comprising:
a heat treatment condition storage unit which stores film-forming conditions of the first film and the second film, the film-forming conditions including a temperature in the processing chamber heated by a heating unit which heats an inside of a processing chamber accommodating a plurality of objects;
a first model storage unit which stores a first model indicating a relationship between the temperature in the processing chamber and a film thickness of the first film to be formed;
a second model storage unit which stores a second model indicating a relationship between the temperature in the processing chamber and a film thickness of the second film to be formed;
a weight calculating unit which calculates weights of the first film and the second film, based on target film thicknesses of the first film and the second film;
a stacked film model preparing unit which prepares a stacked film model indicating a relationship between the temperature in the processing chamber and a film thickness of the stacked films based on the weights calculated by the weight calculating unit, the first model stored in the first model storage unit, and the second model stored in the second model storage unit;
a temperature calculating unit which calculates the temperature in the processing chamber for obtaining a desired film thickness of the stacked films, based on the stacked film model prepared by the stacked film model preparing unit; and
an adjusting unit which adjusts the film thickness of the formed stacked films to be the desired film thickness by changing the temperature in the processing chamber stored in the heat treatment condition storage unit to the temperature calculated by the temperature calculating unit and forming the stacked films at the changed temperature.

* * * * *